US008933829B2

(12) United States Patent
Beier et al.

(10) Patent No.: US 8,933,829 B2
(45) Date of Patent: Jan. 13, 2015

(54) DATA COMPRESSION USING DICTIONARY ENCODING

(71) Applicant: International Business Machines Corporation, Armonk, NY (US)

(72) Inventors: Felix Beier, Ilmenau (DE); Carlos J. Caballero Grolimund, Stuttgart (DE); Vijayshankar Raman, Sunnyvale, CA (US); Knut Stolze, Jena (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/033,689

(22) Filed: Sep. 23, 2013

(65) Prior Publication Data

US 2014/0085115 A1 Mar. 27, 2014

(51) Int. Cl.
*H03M 7/00* (2006.01)
*H03M 7/30* (2006.01)
*H03M 7/42* (2006.01)

(52) U.S. Cl.
CPC .............. *H03M 7/30* (2013.01); *H03M 7/6023* (2013.01); *H03M 7/42* (2013.01)
USPC .......................................... 341/106; 341/107

(58) Field of Classification Search
USPC ..................... 341/106, 107, 87, 94
See application file for complete search history.

(56) References Cited

U.S. PATENT DOCUMENTS

| | | | |
|---|---|---|---|
| 6,075,470 A | | 6/2000 | Little et al. |
| 7,167,115 B1 * | | 1/2007 | Mondal et al. .................. 341/87 |
| 7,283,072 B1 * | | 10/2007 | Plachta et al. ................ 341/107 |
| 7,496,589 B1 | | 2/2009 | Jain et al. |
| RE41,152 E * | | 2/2010 | Reynar et al. .................. 708/203 |
| 7,982,636 B2 * | | 7/2011 | Abali et al. ...................... 341/51 |
| 8,108,361 B2 | | 1/2012 | Netz et al. |
| 8,126,855 B2 | | 2/2012 | Faerber et al. |
| 8,326,605 B2 * | | 12/2012 | Balegar et al. .................. 704/10 |
| 2009/0254521 A1 | | 10/2009 | Raman et al. |
| 2010/0250517 A1 | | 9/2010 | Bendel et al. |
| 2011/0029569 A1 | | 2/2011 | Ganesh et al. |
| 2012/0117064 A1 | | 5/2012 | Draese et al. |

FOREIGN PATENT DOCUMENTS

WO 2008009135 A2 1/2008

OTHER PUBLICATIONS

United Kingdom IPO Search Report for Application GB1217036.1; mailed Jan. 25, 2013; 4 pages.

\* cited by examiner

*Primary Examiner* — Brian Young
(74) *Attorney, Agent, or Firm* — Cantor Colburn LLP; Yeen Tham (57) ABSTRACT

Embodiments relate to data compression using dictionary encoding. An aspect includes subdividing a table of uncompressed data into a first block and a second block of complete rows. Another aspect includes determining information about a frequency of occurrence of different values for each column of the first block. Another aspect includes selecting a row of the first block to be removed out of the first block using frequency of occurrence-information. Another aspect includes removing the a row out of the first block to form an updated first block and determining information about a frequency of occurrence of different values for each column of the updated first block. Another aspect includes deriving a dictionary containing code-words for encoding the values of the updated first block. Another aspect includes encoding the values of the updated first block based on the code-words. Another aspect includes adding the removed row to the second block.

20 Claims, 3 Drawing Sheets

|  | Type | Color | Power |
|---|---|---|---|
| B1 | Ferrari | red | high |
|  | Ferrari | red | high |
|  | Ferrari | red | high |
|  | Ferrari | red | high |
|  | Ferrari | red | high |
|  | Ferrari | red | high |
|  | Ferrari | yellow | high |
|  | Ferrari | black | high |
|  | Porsche | red | medium |
|  | Porsche | red | medium |
| B2 | Porsche | black | high |
|  | Porsche | black | high |
|  | Porsche | white | high |
|  | Porsche | white | high |
|  | Porsche | yellow | medium |
|  | VW | red | low |
|  | VW | red | low |
|  | VW | black | medium |
|  | VW | black | low |
|  | VW | white | medium |
| B3 | VW | white | medium |
|  | VW | yellow | medium |
|  | VW | blue | low |
|  | VW | grey | low |
|  | VW | grey | medium |

DATA COMPRESSION USING DICTIONARY ENCODING

PRIORITY

This application claims priority to Great Britain Patent Application No. GB 1217036.1, filed Sep. 25, 2012, and all the benefits accruing therefrom under 35 U.S.C. §119, the contents of which in its entirety are herein incorporated by reference.

BACKGROUND

The present disclosure relates generally to compression, and more specifically, to data compression using dictionary encoding.

Compression is an important aspect of various computing and storage systems. Most prior art compression schemes suffer from the drawback of being computationally intensive or do not provide an efficient compression.

Lossless compression of relational data is a well-studied problem. Existing compression techniques work by eliminating three kinds of redundancy in relational data: repeated values, skewed data distributions and tuple ordering.

Repeated values are very common in real-world databases. Data items like prices, names, and flags can all be quite long and may appear in many places in a dataset. Dictionary coding, the process of replacing each instance of a data item with a short code-word and using a dictionary data structure to convert code-words back into values, can reduce the size of such data items.

Skewed data distributions are also very common in real-world applications. Entropy coding is a version of dictionary coding that takes advantage of this skew by assigning shorter codes to more common values, while giving less common values longer codes. For example, while the first name column in a payroll database may support strings of up to 255 characters, in practice there may be only a few thousand names, and among these some names are much more common than others. By using a dictionary to store the values, we save on repeated names, and by using an entropy code to index the dictionary, we save bits for representing the most common values.

Entropy compression comprises a range of techniques for compressing data close to its entropy, the theoretical limit of compressability as defined by Shannon's Information Theory. Entropy compression techniques must exploit skew, differences in the frequencies of data values or combinations of values. Huffman coding and arithmetic coding are commonly used techniques for entropy coding. In either scheme, frequent data values are represented using short codes, less frequent values are represented with middle length codes, and infrequent values are represented with longer codes.

Seemingly inherent in entropy compression is the property that they result in sequences of variable length codes. This is a problem because as the codes are variable length, we need to determine the length of code i before we can start parsing code i+1, because otherwise we would not know where code i+1 begins. Dealing with the codes one by one reduces the ability to parallelize the processing of many codes in a long sequence.

Making efficient use of modern processors requires using parallelism. Modern processors have three forms of parallelism. Processors contain multiple cores which can run independent threads or processes. Each core can itself exploit Instruction Level Parallelism, where a processor can execute several instructions simultaneously as long as those instructions do not depend on each other. Each instruction can exploit data parallelism, where long registers (64 or 128 bits in most cases) or vectors contain many data items packed closely together and manipulated as a unit.

Sequences of variable length codes make it hard to take advantage of instruction level or data level parallelism, and that limits the effectiveness of each core, slowing down the rate at which data values can be processed from 4 to 16 times, depending on the number of functional units and the width of the registers or vectors. Core level parallelism is not affected by traditional entropy encoding, it is done intelligently.

As mentioned earlier, a well-known type of entropy coding is Huffman coding, which produces prefix codes. In Huffman coding, shorter code-words are guaranteed not to be prefixes of longer code-words. As a result, each code-word implicitly encodes its own length as well as a value of the code. This property allows a compression system to pack code-words of different lengths together. During decompression, the system uses the implicit length information to find the boundaries of the packed code-words.

Relational compression techniques also reduce the size of data by stripping out tuple ordering. Relations are sets, so any information about the order of tuples in a relation is redundant information. A system can remove this redundancy by sorting and delta-encoding compressed tuples. Instead of storing the binary representation of every tuple directly, delta-encoding represents each bit string as a difference, or delta, from the previous tuple's bit string. Since these deltas are relatively small numbers, they can be encoded in fewer bits than the compressed tuples, and can be further compressed using an entropy code.

In the context of an online analytical processing (OLAP) star schema, this compression typically proceeds in three passes over the data. First, the system analyzes the data to determine an optimal coding of the values from each column so as to approach entropy. Then it joins the fact table and dimension tables to form a single "universal" relation and at the same time converts each tuple of the relation into a tuple-code, or concatenation of code-words, by dictionary-coding each field. The final pass involves sorting and delta-encoding the tuplecodes and writing out the encoded delta values. Decompression happens in the reverse order: the delta-coding is undone and individual fields are decoded as needed, using the dictionary.

As we noted previously, variable-length dictionary codes are essential to achieving acceptable compression ratios when compressing relational data. Unfortunately, variable-length codes are also a major source of central processing unit (CPU) overhead in today's compressed databases.

The compressor packs the individual compressed field codes of a tuple into a tuplecode. To access the i'th field of a tuplecode, the system must parse fields 1 through i−1 to determine their code lengths. This parsing creates control and data dependencies that severely impact performance on modern processors. Worse, these dependencies frustrate the goal of avoiding any decompression costs. We would like to avoid accessing the portions of the tuple that are not relevant to the query, but the cascading field offsets within a tuplecode force the system to compute many more code lengths than are necessary. Such overhead is a well-known problem in the prior art.

Determining cells for efficient compression of table data based on frequency partitioning suffer from several problems. The number of cells grows exponentially with the number of columns in the table, so the computational effort also grows exponentially. The number of columns also puts pressure on memory requirements, because the more columns are in the original table, the more frequency histograms have to be built. Furthermore the approach to scan all the data to build the frequency histograms requires that all data is processed twice: first for building the frequency histograms and later on for the actual compression. If the data volume exceeds the available memory resources, it has to be written to an external disk. After building the frequency histograms new available data cannot be encoded. A re-encoding is necessary.

In frequency partitioning mostly a fixed cell block size is used. The cells containing less-frequent values in one of the columns are often partially empty, so memory space is wasted.

BRIEF SUMMARY

Methods, systems, and computer program products for data compression using dictionary encoding are provided. An aspect includes providing at least one table of uncompressed data with values arranged in columns and rows. Another aspect includes subdividing the table into at least a first block and a second block of complete rows. Another aspect includes selecting the first block of rows to be processed to perform the data compression. Another aspect includes determining information about a frequency of occurrence of different values for each column of the first block. Another aspect includes evaluating and selecting at least one row of the first block to be removed out of the first block using frequency of occurrence-information to reduce code-word length. Another aspect includes removing the at least one row out of the first block to form an updated first block. Another aspect includes determining information about a frequency of occurrence of different values for each column of the updated first block. Another aspect includes deriving at least one dictionary containing code-words for encoding the values of the updated first block. Another aspect includes encoding the values of the updated first block based on the code-words of the at least one dictionary. Another aspect includes adding the at least one removed row to the second block.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

Various embodiments will now be described, by way of example only, with reference to the following drawings in which.

DETAILED DESCRIPTION

Embodiments of data compression using dictionary encoding are provided. At least one table of uncompressed data with values arranged in columns and rows is provided. The table is subdivided in at least a first and a second block of complete rows, and the first block of rows is selected to be processed to perform the data compression. Information about the frequency of occurrence of different values for each column of the first block is determined. At least one row of the first block is evaluated and selected to be removed out of the first block using frequency of occurrence-information to reduce code-word length. The least one selected row is removed from the first block resulting in an updated first block. Information is determined about the frequency of occurrence of different values for each column of the first updated block. At least one dictionary is derived containing code-words for encoding the values of the first updated block. The values of the first updated block are encoded based on the code-words of the at least one dictionary. The at least one removed row is added to the second block.

Simple parallel processing of the different blocks without need to merge dictionaries is possible. If multiple processors or processor cores are working parallel and handle the data of one block, each processor can do its own block processing independently. Furthermore if a fixed block size is used for subdividing the table the number of blocks grows only linearly in contrary to the exponential increase of the number of cells in frequency partitioning. All encoded rows will have exactly the same number of bits so that efficient query processing using single instruction multiple data (SIMD) processor instructions are still possible.

In addition removing complete rows, i.e. rows containing values of all columns of the table, out of a currently processed block and adding it to a further block leads to a shorter code-word length. Therefore the dictionary associated to each block is optimal for encoding the data to save memory resources.

In some embodiments, the evaluating at least one row to be removed, removing the evaluated row resulting in an updated first block and determining information about the frequency of occurrence of different values for each column of the first updated block are repeated iteratively to reduce the code-word length. When repeating this loop a good balance between the numbers of rows in the current block and efficient, short code-words can be reached. Preferably the data volume in the current block still has a critical mass, i.e. the number of rows to be removed out of the block is limited to keep the number of rows contained in the block as high as possible.

In some embodiments, the rows containing the less-frequent values of the respective columns are removed until a shorter code-word length is reached. Pushing rows containing values with less frequent values out of the block reduces the code-word-length rapidly while plenty of rows containing values with high frequency can be encoded using shortened code-words.

In some embodiments, the rows to be removed are selected using a frequency threshold-value. For example, if a value only appears once or twice in a column the row containing that value is a candidate to be removed out of the current processed block. Defining a frequency threshold-value is a simple criterion for selecting rows to be removed which does not require high computational effort.

In some embodiments, the rows to be removed are selected using frequency partitioning by dividing the values in each column into column partitions according to the frequency by using frequency histograms and forming cells by building the cross-product of the column partitions. Using a frequency partitioning method is an intelligent way of selecting rows not only taking the frequency distribution in one column into account but also the frequency distribution of several columns. Each block may be partitioned into a very small number of cells to keep the computational overhead as low as possible. At least the rows contained in the cell which keeps the less frequent values of each column are removed out of the current block. It is also possible to keep only rows of the first cell with the most frequent values in the current block and remove the rest of the rows. As will be appreciated by one skilled in the art, also some variations in between are possible.

In some embodiments, the second block is an un-encoded block which is processed subsequently. The removed rows may build a bow-wave during processing of multiple blocks, pushing the rows that impact the compression in a negative way ahead, always into the block to be processed next. In worst case the removed row is pushed until the very end of all blocks. In each block there is the chance to encode the values of the pushed row without negative impact to the compression ratio.

In some embodiments, an evaluation is performed if the row to be removed out of the current block can be encoded using a dictionary of an already processed second block. Preferably the evaluation is done before pushing the row into a block to be processed next. The benefit of testing rows against the dictionaries of already-existing blocks is to check whether the row fits to the dictionary of a previously compressed block. This will lead to shorter codes and an improved compression.

In some embodiments, another evaluation is performed if the row to be removed can be added to an already processed second block creating a new code-word in the dictionary without increasing the code-word length. So, even if not all of the rows values can be encoded and if there is still space in the dictionary to encode the non-matching values, the row may be added to the already processed block. For example, if the dictionary for one of the columns has only 3 entries (which require 2 bits) a fourth entry can be added without increasing the code-word length.

In some embodiments, the table is sorted before subdividing in blocks by grouping complete rows containing most frequent values together. Sorting the table before subdividing in blocks will establish good starting conditions for creating blocks, which initially contains rows that lead to short codewords without the need of removing any rows or only removing some of the rows to reach a good balance between the number of rows in the block and efficient encoding using short code-words.

In some embodiments, a time threshold is used to terminate identifying a row to be removed out of the first or updated first block. To guarantee a certain throughput and keep the computational effort as low as possible the search for candidates to be pushed out of the current block is time-limited e.g. some seconds. After the duration of time has expired, the search will terminate, the block is compressed and the processing goes on with the next block.

In some embodiments, rows contained in a partially filled page associated with the first block are moved to the second block. In databases pages build the internal basic structure to organize the data in the database files. All pages have the same fixed page size to reduce memory management overhead, e.g. 1 MB. If a table of a certain size is subdivided in blocks and the blocks are compressed separately, it is not guaranteed that the compressed data will always completely fill all the pages for the block. The last page (called "trailing page") may only be partially-filled. Depending on the page size, this amounts to noticeable overhead. To reduce this overhead preferably all rows that would be stored in the last page of the block are removed out of the block and moved to another block. For example, once a block has been compressed, all rows from the last page are moved to the next block. Another preferable possibility is—at the very end of processing of all blocks—to collect the rows of the trailing pages of each block and add those rows to the last block. This will usually reduce the compression ratio for the last block (because additional values are added, which increase the code length), but this affects only a single block so that the overall compression ratio is not noticeably decreased. It is also possible to remove rows of trailing pages at regular or irregular intervals during block processing and add those rows to the currently processed block.

In some embodiments, at least one column of a certain block is not encoded if there are no or only few repetitions in this column. In dictionary-based encoding a dictionary is used to compress the data and, thus, reduce the storage needed for repeating values by using the short code on the repetitions. If there are no or only very few repetitions in a column, the dictionary mapping the un-encoded value to the encoded value (the code) has the tendency to introduce only overhead. By using block-specific dictionaries preferably a column which contains no or only few repetitions in a single block is not encoded to avoid this overhead. All the other columns of the block are encoded using the block specific dictionary. Doing this is completely independent of the handling for the values of the same column in other blocks. Storing column values un-encoded only requires a single flag (1 bit) in the block. The code processing the data in the block has to test this bit and has to know how to interpret the data.

Some embodiments include a computer-readable medium comprising computer-readable program code embodied therewith which, when executed by a processor, cause the processor to execute a method according to anyone of the embodiments specified above.

Various embodiments may comprise a system, method or computer program product. Accordingly, various embodiments may take the form of an entirely hardware embodiment, an entirely software embodiment (including firmware, resident software, micro-code, etc.) or an embodiment combining software and hardware aspects that may all generally be referred to herein as a "circuit", "module" or "system". Furthermore, aspects of the present invention may take the form of a computer program product embodied in one or more computer readable medium(s) having computer readable program code embodied thereon. Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Figure 1:
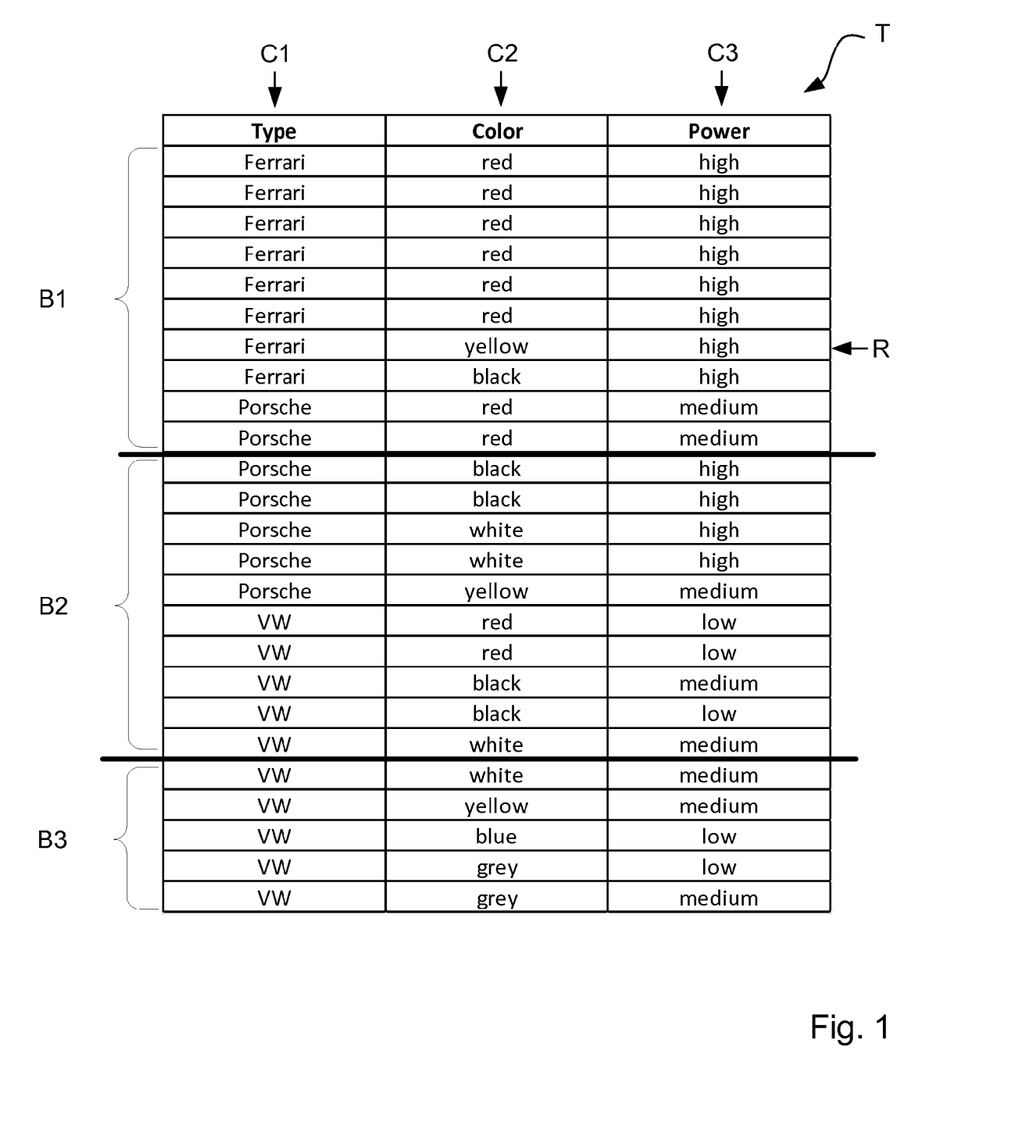
FIG. 1 shows an embodiment of a table subdivided in several blocks.

In FIG. 1 an embodiments of table T is shown in which data are organized in rows R and columns C1-C3. According to the example the data refer to motor-cars and are arranged in three columns C1-C3 with the attributes "Type", "Color" and "Power".

Figure 2:
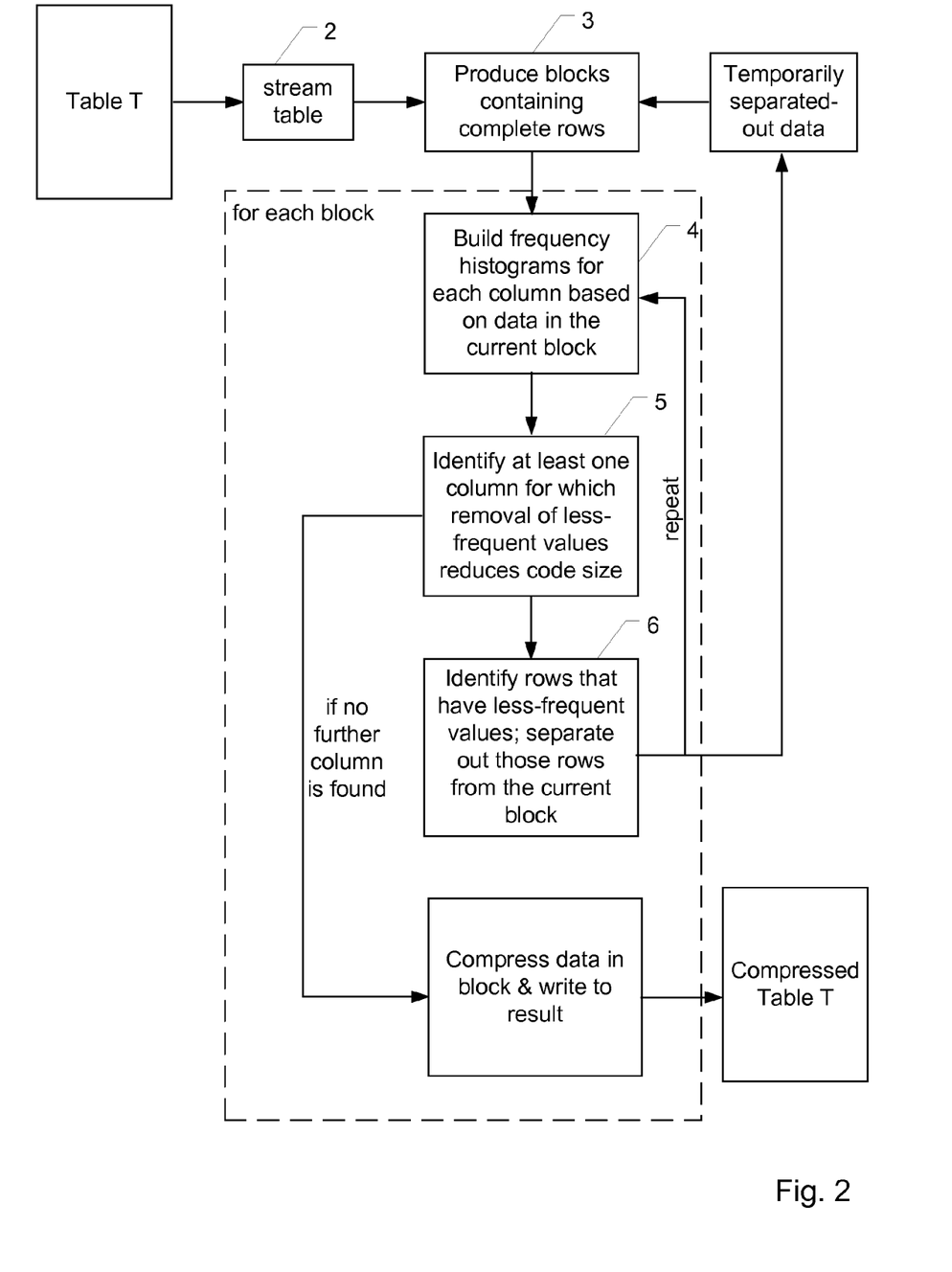
FIG. 2 shows a first flowchart of an embodiment of data compression using dictionary encoding.

FIG. 2 shows a flowchart of an embodiment of a method to compress data using dictionary encoding arranged in tables T.

The provided table T contains uncompressed data arranged in rows R and columns C1-C3. First, the table data are streamed (2). Afterwards the table T is subdivided in blocks (3) wherein each block contains complete rows. Preferably the table is subdivided in blocks having a fixed bock size, for example 100 MB raw uncompressed data. An efficient compression may be achieved by using a dictionary for each block which is optimal for the respective block by reducing the length of the code-words which are contained in the dictionary.

The table data are processed block by block, wherein the blocks can be processed parallel by different processors or processor cores. After selecting a first block B1 to be processed information about the frequency of occurrence of different values for each columns C1-C3 of the first block B1 is determined (4). So-called frequency histograms are used to determine frequency distribution of the values considering only those values that are in the current block. Especially the most frequent and the less frequent values are determined. Subsequently the current length of the code-word for the values contained in each column is determined which is necessary to encode those values.

In the evaluation, columns are identified for which a removal of a less-frequent value would lead to a reduced code-word length (5). If a set of less-frequent values in a column C1-C3 can be found whose removal would lead to a shorter code-word length, the rows containing the values are separated (6). After removing the complete rows out of the block, the code-word length at least for the column C1-C3 which served as the base for the selection of rows is reduced. Preferably the identification of less frequent values in the respective columns is done using the frequency histograms.

According to the example of FIG. 1 the table T is divided in three blocks B1-B3, wherein the blocks B1 and B2 each contain ten rows R and the last block B3 contains the rest of the rows of the table T. The attribute "Type" contained in the first column C1 of the first block B1 has two different values {Ferrari, Porsche}. Using a binary code for encoding, the code-word length is one bit. Also the code-word length for the attribute "Power" contained in the third column C3 of the first block B1 is one bit, because there are only two different values. The situation in the second column C2 is different. The attribute "Color" contained in the second column C2 of the first block B1 includes three different values {red, yellow, black}, wherein the both values {yellow, black} only appear once. So for encoding the second column C2 a code-word length of two bit is necessary. Removing the row containing "yellow" or "black" in column C2 would reduce the number of different values and therefore reduce the code-word length to one bit. Therefore one of the rows {Ferrari, yellow, high} or {Ferrari, black, high} will be separated out and removed out of the current block B1.

In some embodiments, building frequency histograms (4), identifying of columns with less frequent values (5) and identifying and removing rows containing less frequent values (6) will be repeated iteratively, so an improved code-word length for the columns C1-C3 of block B1 will be achieved. The iterative attempt to shorten the code-word is stopped if no further columns are found for which the removal of a less-frequent value would reduce the code-word length. Preferably a termination condition is used to stop the iterative process. The termination condition could be a time threshold for the identification of a row to be removed or a frequency threshold indicating that rows which contain values with a frequency over the frequency threshold will not be removed.

After stopping the iterative process of removing rows with less frequent values the values of the current processed block are encoded with a dictionary containing the code-words with improved code-word length. So each block is assigned with its own dictionary which leads to an optimal memory-saving encoding of this block. After encoding, all rows will have exactly the same number of bits so efficient query processing is possible.

As mentioned above, in the example according to FIG. 1 the rows {Ferrari, yellow, high} or {Ferrari, black, high} will be separated out and removed out of the current block B1. There are two possibilities to handle the removed row. First it is possible to add the removed row to a second block which is processed next. After adding the row to the second block frequency histograms are built (4) for the second block, columns with less frequent values (5) are identified and the rows containing those less frequent values (6) are identified and removed to reach shorter code-word length for the columns of the second block. In other words, the rows which enlarge the code-word length are pushed forward form one block to the next block.

In some embodiments, the removed or separated—out row is added to a block, which has already been processed, if the row could be compressed using the dictionary of the existing block. The benefit of testing removed or separated—out rows against the dictionaries of already existing blocks is the increased chance that those rows do not increase the code-word length needed to encode the columns of the current block. If a block is found whose dictionary could encode the removed or separated—out row, the row is added to the already processed block and the block is re-encoded.

There are various options to reduce the computational overhead for scanning the dictionaries of the respective blocks to test whether a row could be encoded using one of them, wherein combinations of various options are possible. The number of dictionaries/blocks to be tested could be limited. Especially only the dictionary of the last block may be tested. That is especially beneficial if the data is sorted in some fashion. A time limit may be set for scanning the existing dictionaries. If no dictionary is found which can be used for encoding the current row, the row is added to the next block to be processed. The dictionary may contain meta-data for indexing the minimum and maximum value of numeric values. The minimum and maximum value defines a range for the numeric values in each column. No scanning of an actual dictionary is necessary if the numeric value contained in a row to be encoded is not within the range, i.e. the actual dictionary is not a potential candidate for encoding the row. Also multi-dimensional indexing for dictionaries is possible.

In addition, a removed or separated—out row may also be added to an already processed block if not all of the values contained in the removed or separated—out row can be encoded with the existing dictionary, namely if there is the possibility to encode the non-matching value without enlarging the code-word length associated with the respective column. For example, if the dictionary for one of the columns has only tree entries (two bits), a fourth entry can be added without increasing the code-word length of the column. Adding new values to an existing dictionary would potentially destroy the order-preserving nature of the dictionary. So the addition can either be made only if the new value to be added is the largest one so that the compressed code would also be the largest and the order-preservation is kept. Alternatively, the data in the block will have to be reorganized to re-establish an order-preserving dictionary.

Figure 3:
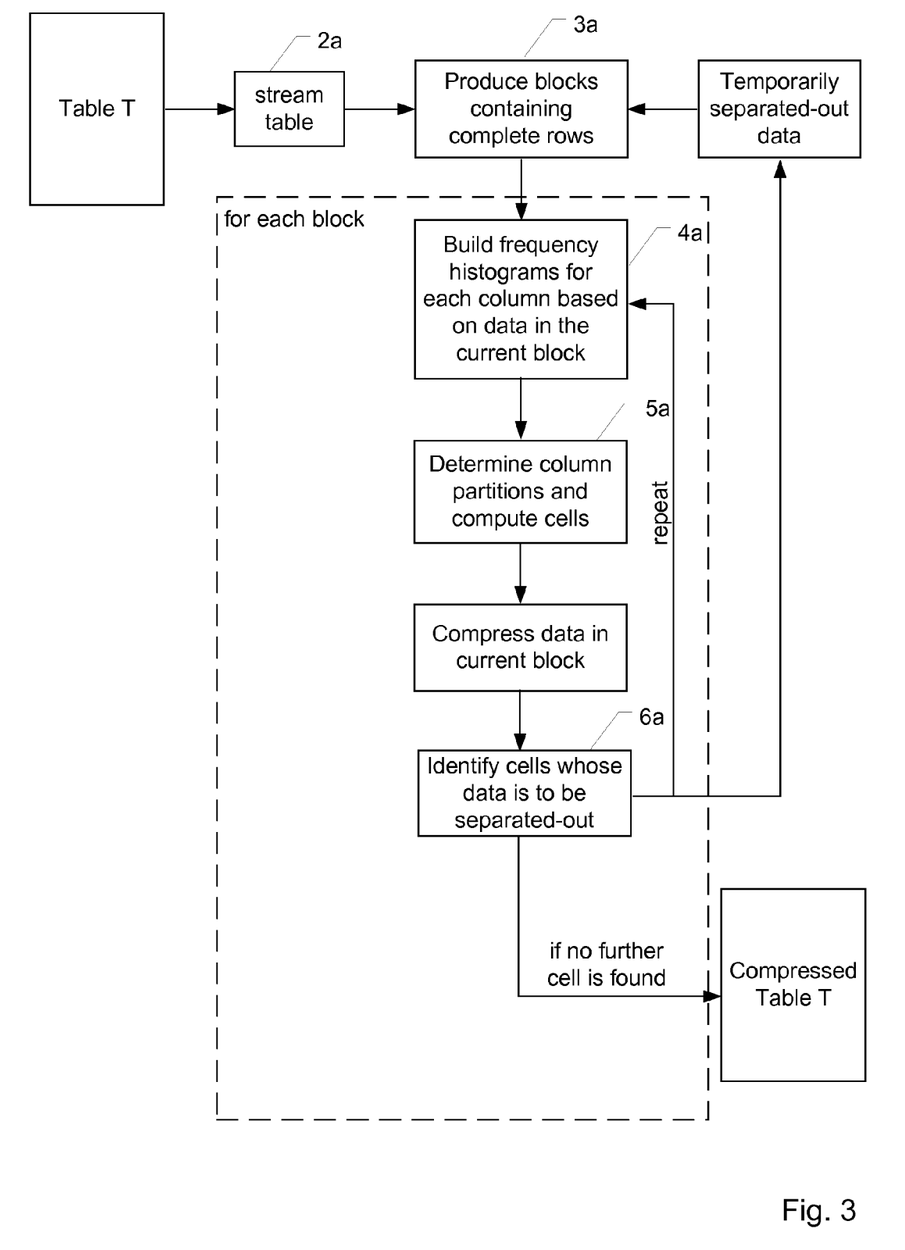
FIG. 3 shows a second flowchart of an embodiment of data compression using dictionary encoding.

FIG. 3 a flowchart of an embodiment of method to compress data using dictionary encoding. To encode the table T, the table data are streamed (2a) and subdivided in blocks (3a) as described previously. After dividing the table in several blocks each block of the table T is processed using at least parts of frequency partitioning method described in US Patent Application 2009/0254521 A1 which is fully incorporated herewith by reference. A current block is selected and frequency histograms for each column based on the data of the current block are built (4a). Based on the frequency histograms of the respective columns column partitions are built so values with similar probability of occurrence are in the same partition. Subsequently, cells are formed by building the cross-product of those column partitions (5a). Those cells form the basis for the decision which row/rows to be removed out of the current processed block. For example, all rows which fall in the last cell with the less frequent values of each column are removed out of the current processed block. Also rows contained in the last cell of each column can be collected to form a new block. It is also possible to only keep rows of the first cell with the most frequent values in the current block and remove the rest of the rows. As will be appreciated by one skilled in the art, also some variations in between are possible. For further reducing the code-word length, the building frequency histograms (4a), building column partitions and cells (5a) and identifying cells whose rows should be removed (6a) will be repeated iteratively.

After stopping the iterative process the current block with the remaining rows is encoded. The rows which were removed out of the block can be added to the next block to be processed or an attempt can be taken to add the removed rows to a previously processed block as described above.

Preferably the table T is sorted in some manner before subdividing in blocks. Most preferably the table T is sorted such that the values are grouped together according to their frequency. Sorting the table will lead to an order of rows that reduces the computational overhead of removing rows which enlarge the code-word length.

The approach using block-specific dictionaries offers efficient ways for reorganizing the data. Reorganization may be needed, e.g. because rows were logically removed and need to be purged from the in-memory structures to free up the occupied memory. For example in the database all entries older than 01.01.2002 should be removed, because those data are no longer needed. Other reason may be to improve the overall compression ratio across blocks. The data no longer needed are deleted. After purging the blocks, the blocks can be compressed again trying to reduce the code-word length because of an reduced amount of values. This can be done incrementally or on the whole block with a single atomic swap. Since each block has only a fixed amount of raw data (e.g. 100 MB), it is usually possible to do the reorganization in one shot and no incremental approach to control memory consumption is needed.

For recompressing the data, the data in the block is scanned, new frequency histograms are built, and a block with new pages holding the newly compressed data is created and (atomically) swapped with the old block. Memory can be controlled easily based on the amount of data in the block.

It may also happen that a whole block vanishes during this processing, e.g. if the block only contained logically deleted data. It is important to note that the removal has no impact on any other block and the data therein.

In some embodiments of the invention an implicit exploration of column value correlations is done. For example, if many values in column "Type" are the string 'Ferrari', the corresponding values in column "Color" will often be 'red' (FIG. 1). Thus, the values 'Ferrari' and 'red' occur rather frequently. If other values in either column are less frequent and would cause an unnecessary increase of the code length ('yellow', 'black'), rows containing such values have a very good chance of being pushed out of the block. That increases the relative frequency of the remaining values in the block and, thus, the compression ratio for the remaining rows in the block.

It will be clear to one of ordinary skill in the art that all or part of the method of various embodiments may suitably and usefully be embodied in additional logic apparatus or additional logic apparatuses, comprising logic elements arranged to perform the method and that such logic elements may comprise additional hardware components, firmware components or a combination thereof.

It will be equally clear to one of skill in the art that some or all of the functional components of various embodiments may suitably be embodied in alternative logic apparatus or apparatuses comprising logic elements to perform equivalent functionality using equivalent method, and that such logic elements may comprise components such as logic gates in, for example a programmable logic array or application-specific integrated circuit. Such logic elements may further be embodied in enabling elements for temporarily or permanently establishing logic structures in such an array or circuit using, for example, a virtual hardware descriptor language, which may be stored and transmitted using fixed or transmittable carrier media.

It will be appreciated that the method and arrangement described above may also suitably be carried out fully or partially in software running on one or more processors (not shown in the figures), and that the software may be provided in the form of one or more computer program elements carried on any suitable data-carrier (also not shown in the figures) such as a magnetic or optical disk or the like. Channels for the transmission of data may likewise comprise storage media of all descriptions as well as signal-carrying media, such as wired or wireless signal-carrying media.

Various embodiments may further suitably be embodied as a computer program product for use with a computer system. Such an implementation may comprise a series of computer-readable instructions either fixed on a tangible medium, such as a computer readable medium, for example, diskette, CD-ROM, ROM, or hard disk, or transmittable to a computer system, using a modem or other interface device, over either a tangible medium, including but not limited to optical or analogue communications lines, or intangibly using wireless techniques, including but not limited to microwave, infra-red or other transmission techniques. The series of computer readable instructions embodies all or part of the functionality previously described herein.

Those skilled in the art will appreciate that such computer readable instructions can be written in a number of programming languages for use with many computer architectures or operating systems. Further, such instructions may be stored using any memory technology, present or future, including but not limited to, semiconductor, magnetic, or optical, or transmitted using any communications technology, present or future, including but not limited to optical, infra-red, or microwave. It is contemplated that such a computer program product may be distributed as a removable medium with accompanying printed or electronic documentation, for example, shrink-wrapped software, pre-loaded with a computer system, for example, on a system ROM or fixed disk, or distributed from a server or electronic bulletin board over a network, for example, the Internet or World Wide Web.

Various embodiments may be realized in the form of a computer implemented method of deploying a service comprising deploying computer program code operable to, when deployed into a computer infrastructure and executed thereon, cause the computer system to perform the method.

Various embodiments may be realized in the form of a data carrier having functional data thereon, said functional data comprising functional computer data structures to, when loaded into a computer system and operated upon thereby, enable said computer system to perform the method.

It will be clear to one skilled in the art that many improvements and modifications can be made to the foregoing exemplary embodiment without departing from the scope of the present invention.

What is claimed is:

1. A computer-implemented method for data compression using dictionary encoding, the method comprising:
    providing at least one table of uncompressed data with values arranged in columns and rows;
    subdividing the table into at least a first block and a second block of complete rows;
    selecting the first block of rows to be processed to perform the data compression;
    determining information about a frequency of occurrence of different values for each column of the first block;
    evaluating and selecting at least one row of the first block to be removed out of the first block using frequency of occurrence-information to reduce code-word length;
    removing the at least one row out of the first block to form an updated first block;
    determining information about a frequency of occurrence of different values for each column of the updated first block;
    deriving at least one dictionary containing code-words for encoding the values of the updated first block;
    encoding the values of the updated first block based on the code-words of the at least one dictionary; and
    adding the at least one removed row to the second block.

2. The method of claim 1, wherein evaluating the at least one row to be removed, removing the evaluated at least one row resulting in the updated first block, and determining information about the frequency of occurrence of different values for each column of the updated first block are repeated iteratively to reduce the code-word length.

3. The method of claim 1, wherein the rows containing less-frequent values of the respective columns are removed until a shorter code-word length is reached.

4. The method of claim 1, wherein the rows to be removed are selected using a frequency threshold-value.

5. The method of claim 1, wherein the rows to be removed are selected using frequency partitioning by dividing the values in each column into column partitions according to the frequency by using frequency histograms and forming cells by building a cross-product of the column partitions.

6. The method of claim 1, wherein the second block is an un-encoded block which is processed subsequently.

7. The method of claim 1, further comprising evaluating whether the row to be removed can be encoded using a dictionary of an already processed second block.

8. The method of claim 1, further comprising evaluating whether the row to be removed can be added to an already processed second block creating a new code-word in the dictionary without increasing the code-word length.

9. The method of claim 1, wherein the table is sorted before subdividing into the first block and the second block by grouping complete rows containing most frequent values together.

10. The method of claim 1, wherein a time threshold is used to terminate identifying a row to be removed out of the first block or the updated first block.

11. The method of claim 1, wherein rows contained in a partially filled page associated with the first block are moved to the second block.

12. The method of claim 1, wherein at least one column of a block is not encoded if there are no or only few repetitions in the at least one column.

13. A computer system for data compression using dictionary encoding, comprising
    an input-interface for receiving at least one table of uncompressed data with values arranged in columns and rows;
    a pre-processing component for subdividing the table into at least a first block and a second block of complete rows and selecting the first block of rows to be processed to perform the data compression;
    a processing component configured to:
        determine information about a frequency of occurrence of different values for each column of the first block;
        evaluate and selecting at least one row of the first block to be removed out of the first block using frequency of occurrence-information to reduce code-word length;
        remove the at least one row out of the first block to form an updated first block; and
        determine information about a frequency of occurrence of different values for each column of the updated first block; and
    a compression component configured to:
        derive at least one dictionary containing code-words for encoding the values of the updated first block;
        encode the values of the updated first block based on the code-words of the at least one dictionary; and
        add the at least one removed row to the second block.

14. The computer system according to claim 13, wherein evaluating the at least one row to be removed, removing the evaluated at least one row resulting in the updated first block, and determining information about the frequency of occurrence of different values for each column of the updated first block are processed iteratively to reduce the code-word length.

15. The computer system according to claim 13, wherein the rows containing less-frequent values of the respective columns are removed until a shorter code-word length is reached.

16. The computer system according to claim 13, wherein the rows to be removed are selected using a frequency threshold-value.

17. The computer system according to claim 13, wherein the rows to be removed are selected using frequency partitioning by dividing the values in each column into column partitions according to the frequency by using frequency histograms and forming cells by building a cross-product of the column partitions.

18. The computer system according to claim 13, wherein the processing component or encoding component is configured to evaluate whether the row to be removed can be encoded using a dictionary of an already processed second block.

19. The computer system according to claim 13, wherein the processing component or encoding component is configured to evaluate whether the row to be removed can be added to an already processed second block creating a new code-word in the dictionary without increasing the code-word length.

20. A non-transitory computer-readable medium comprising computer-readable program code embodied therewith which, when executed by a processor, causes the processor to execute a method for data compression using dictionary encoding comprising:

providing at least one table of uncompressed data with values arranged in columns and rows;

subdividing the table into at least a first block and a second block of complete rows;

selecting the first block of rows to be processed to perform the data compression;

determining information about a frequency of occurrence of different values for each column of the first block;

evaluating and selecting at least one row of the first block to be removed out of the first block using frequency of occurrence-information to reduce code-word length;

removing the at least one row out of the first block to form an updated first block;

determining information about a frequency of occurrence of different values for each column of the updated first block;

deriving at least one dictionary containing code-words for encoding the values of the updated first block;

encoding the values of the updated first block based on the code-words of the at least one dictionary; and adding the at least one removed row to the second block.

* * * * *